(12) United States Patent
He et al.

(10) Patent No.: US 11,079,419 B2
(45) Date of Patent: Aug. 3, 2021

(54) SYSTEM FOR TESTING NAKAGAMI FADING CHANNEL AND VERIFICATION METHOD THEREOF

(71) Applicant: WUHAN UNIVERSITY, Hubei (CN)

(72) Inventors: Yigang He, Hubei (CN); Yuan Huang, Hubei (CN); Hui Zhang, Hubei (CN); Bing Li, Hubei (CN); Baiqiang Yin, Hubei (CN); Jiajun Duan, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 515 days.

(21) Appl. No.: 16/001,957

(22) Filed: Jun. 7, 2018

(65) Prior Publication Data
US 2019/0277895 A1    Sep. 12, 2019

(30) Foreign Application Priority Data

Mar. 12, 2018   (CN) .......................... 201810201309.5

(51) Int. Cl.
*G01R 23/18* (2006.01)
*G06F 17/18* (2006.01)

(52) U.S. Cl.
CPC ............. *G01R 23/18* (2013.01); *G06F 17/18* (2013.01)

(58) Field of Classification Search
CPC ......... G01R 23/18; G06F 17/18; H04B 17/29; H04B 17/3911; H04B 17/3912; H04B 17/0085
See application file for complete search history.

(56) References Cited

U.S. PATENT DOCUMENTS

| 2013/0188672 A1* | 7/2013 | Chiang | H04B 17/29 |
| | | | 375/219 |
| 2018/0167939 A1* | 6/2018 | Kim | H04L 27/2662 |

FOREIGN PATENT DOCUMENTS

| CN | 102130734 | 2/2014 |
| CN | 104052557 | 6/2016 |

OTHER PUBLICATIONS

"Simulating Fading with R&S® Vector Signal Generators", Application Note, Rohde & Schwarz GmbH & Co. KG, 50 pages, 2014.*

(Continued)

*Primary Examiner* — Alexander Satanovsky
(74) *Attorney, Agent, or Firm* — JCIPRNET

(57) ABSTRACT

A system for testing a Nakagami fading channel and a verification method thereof are provided. The testing system includes a signal generator, a Nakagami fading channel simulator, and a computer. The signal generator is used to output a sine wave signal whose frequency is f and transmit the sine wave signal to the Nakagami fading channel simulator and the computer. The Nakagami fading channel simulator is used to generate a Nakagami fading channel. The computer is used to perform data processing and analysis. In the verification method, time domain fading characteristics, first-order statistics characteristics, and second-order statistics characteristics of the Nakagami fading channel are respectively verified. Verifying the time domain fading characteristics is verifying a waveform fluctuation rate and a fluctuation range on a time domain under different Nakagami fading factors. Verifying the first-order statistics characteristics is mainly verifying amplitude and phase distribution statistics characteristics of the Nakagami fading channel by means of Kolmogorov Smirnov (KS) hypothesis test. Verifying the second-order statistics characteristics is mainly verifying the shape and bandwidth of a power spectrum density function. In the present invention, verifi- (Continued)

cation on performance of the Nakagami fading channel simulator or a simulation model has features of accuracy and feasibility.

3 Claims, 5 Drawing Sheets

(56) References Cited

OTHER PUBLICATIONS

Guoxinjun et al., "A Simulation method for Nakagami Fading Channel", 2010 14th International Symposium on Antenna Technology and Applied Electromagnetics, 4 pages, 2010.*

* cited by examiner

SYSTEM FOR TESTING NAKAGAMI FADING CHANNEL AND VERIFICATION METHOD THEREOF

CROSS-REFERENCE TO RELATED APPLICATION

This application claims the priority benefit of China application serial no. 201810201309.5, filed on Mar. 12, 2018. The entirety of the above-mentioned patent application is hereby incorporated by reference herein and made a part of this specification.

BACKGROUND OF THE INVENTION

1. Field of the Invention

The present invention relates to the field of radio channel modeling and simulation, and more specifically, to a system for testing a Nakagami fading channel and a verification method thereof.

2. Description of Related Art

After long-term research on radio channel fading characteristics, people find and summarize fading statistical distribution and models of a plurality of channels. Channel statistical models commonly used for describing small-scale fading include a Rayleigh model, Rician model, and a Nakagami model. The Nakagami model, such as a Rayleigh fading channel and a Rician fading channel, can flexibly represent different degrees of fading, shows a higher matching degree in a practical wireless communication environment test, and therefore is more widely applied in theoretical modeling analysis and a practical test. A patent with Application No. 201410288810.1 and Authorized Publication No. CN104052557 B discloses a method for modeling a Nakagami repeated fading channel. A patent with Application No. 201110101732.6 and Authorized Publication No. CN102130734 B discloses a method for modeling and simulating a Nakagami fading channel. The foregoing two patents both provide a method for modeling a Nakagami fading channel, and a verification result is obtained by only simply comparing a theoretical value with a simulation value and does not mention a method related to how to scientifically verify effectiveness and accuracy of the model. Thus, to ensure good performance of a Nakagami fading channel simulator or a simulation model, a comprehensive and feasible verification technical solution is needed.

SUMMARY OF THE INVENTION

The technical problem to be resolved by the present invention is, specific to the foregoing disadvantages existing in the prior art, to provide a system for testing a Nakagami fading channel and a verification method thereof, to provide a verification solution for performance of an existing Nakagami fading channel simulator or a related simulation model.

The technical solutions used by the present invention to resolve the foregoing technical problem are:

A system for testing a Nakagami fading channel includes a signal generator, a Nakagami fading channel simulator, and a computer, where the signal generator is unidirectionally connected to the Nakagami fading channel simulator and the computer respectively by using SMA cables, and the Nakagami fading channel simulator is unidirectionally connected to the computer by using a GPIB general purpose interface bus.

The signal generator is used to output a sine wave signal x whose frequency is f, and the sine wave signal x is transmitted to the Nakagami fading channel simulator and the computer respectively by using the SMA cables.

The Nakagami fading channel simulator is used to generate a Nakagami fading channel y, and during a testing process, a maximum Doppler frequency shift $f_d$, loss, a Rician factor K, a phase, and a Nakagami fading factor m are set for the Nakagami fading channel simulator, where m is 1 or $(K+1)^2/(2K+1)$, one Nakagami fading channel path channel is opened, and the remaining path channels are closed.

And the computer is used to operate and analyze the Nakagami fading channel y output in a radio frequency manner from the Nakagami fading channel simulator, to obtain performance indexes of the Nakagami fading channel on a time domain and a frequency domain, to verify accuracy of the channel model.

The present invention further provides a Nakagami fading channel verification method of the system for testing a Nakagami fading channel, where data processing of operation and analysis is mainly performed on a computer, and the method includes the following steps.

Step S1: start a program, perform parameter initialization, and set a sampling frequency and a carrier frequency of the testing system.

Step S2: verify time domain fading characteristics of the Nakagami fading channel.

Step S3: verify first-order statistics characteristics of the Nakagami fading channel.

Step S4: verify second-order statistics characteristics of the Nakagami fading channel.

And step S5: end the program.

Further, the verifying time domain fading characteristics of the Nakagami fading channel in step S2 specifically includes: obtaining a Nakagami fading channel h by means of enveloping of the high-frequency signal y obtained by the computer, then observing whether an amplitude waveform of the Nakagami fading channel h quickly fluctuates on the time domain, where a fluctuation range of the amplitude waveform of the Nakagami fading channel h is 30 dB to −60 dB; verifying whether the Nakagami fading channel conforms to features of a Rayleigh fading channel when the Nakagami fading factor m is 1; and verifying whether the Nakagami fading channel conforms to features of a Rician fading channel when the Nakagami fading factor m is $(K+1)^2/(2K+1)$.

Further, the verifying first-order statistics characteristics of the Nakagami fading channel in step S3 includes: separately performing amplitude and phase statistical analysis on the obtained Nakagami fading channel h, where it is known from theories that Rayleigh fading channel amplitude statistics is subject to Rayleigh distribution, and phase statistics is subject to uniform distribution; Rician fading channel amplitude statistics is subject to Rician distribution, and the angle statistics is subject to Gaussian distribution; that feature parameters of probability density functions of Rayleigh distribution, Rician distribution, uniform distribution, and Gaussian distribution are all represented by σ are assumed; in engineering, statistical verification is performed on the Nakagami fading channel h based on a Kolmogorov Smirnov hypothesis test theory, and a verification method is the following.

S31: respectively obtain an amplitude sequence H and a phase sequence θ of the Nakagami fading channel h.

S32: set a significance level α.

S33: obtain a theoretical value of the parameter σ and a corresponding confidence interval Ω by means of least squares estimation.

S34: respectively calculate true and theoretical cumulative distribution functions of the amplitude sequence H and the phase sequence θ.

And S35: perform random distribution verification by means of Kolmogorov Smirnov (KS) hypothesis test.

Further, the verifying second-order statistics characteristics of the Nakagami fading channel in step S4 specifically includes:

Separately performing autocorrelation and Doppler power spectrum analysis on the obtained Nakagami fading channel h, to mainly verify the shape and bandwidth of a power spectrum density function, where in theory, when the Nakagami fading factor m is 1, the power spectrum density function is a "standard Rayleigh U-shaped power spectrum" and a spectral bandwidth is approximately 2 $f_d$; when the Nakagami fading factor m is $(K+1)^2/(2K+1)$, the power spectrum density function is a "standard Rician U-shaped power spectrum" and carries a line-of-sight signal with a Doppler frequency shift, and the spectral bandwidth is approximately $2f_d$.

The present invention has the following advantages compared with an existing modeling verification method:

1. A more scientific, accurate, and effective solution is implemented based on statistics rather than by depending on simple comparison of simulation patterns.

2. The verification method of the testing system mainly applies a statistics classic KS hypothesis test method, is capable of accurately verifying amplitude and phase distribution types of the first-order statistics characteristics of the Nakagami fading channel, is capable of obtaining the confidence interval according to the significance level, and is capable of providing reliability of a measurement value of a measured parameter in engineering.

3. The verification method has good feasibility and enforceability and provides a reliable verification solution to subsequent research on other radio channel fading models.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
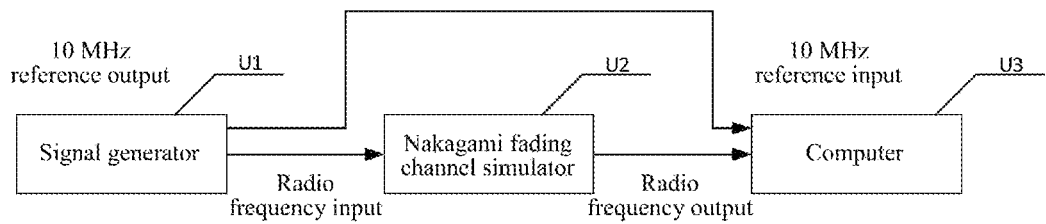
FIG. 1 is an instrument connection diagram of a system for testing a Nakagami fading channel according to the present invention.

Reference will now be made in detail to the present preferred embodiments of the invention, examples of which are illustrated in the accompanying drawings. Wherever possible, the same reference numbers are used in the drawings and the description to refer to the same or like parts.

The following describes the technical solutions of the present invention in detail with reference to the accompanying drawings and embodiments.

Referring to FIG. 1, a system for testing a Nakagami fading channel in the present invention includes a signal generator U1, a Nakagami fading channel simulator U2, and a computer U3, where the signal generator U1 is unidirectionally connected to the Nakagami fading channel simulator U2 and the computer U3 respectively by using SMA cables, and the Nakagami fading channel simulator U2 is unidirectionally connected to the computer U3 by using a GPIB general purpose interface bus.

The signal generator U1 is used to output a sine wave signal x whose frequency is f and that has an appropriate power. In this embodiment, the signal generator U1 uses an Agilent 33511B 2 channel 20 MHz function signal generator. During a testing process, the signal generator U1 outputs a sine wave signal x with frequency f is 10 MHz and power level is −10 dB, and the sine wave signal x is transmitted to the Nakagami fading channel simulator U2 and the computer U3 respectively by using the SMA cables (data cable).

The Nakagami fading channel simulator U2 is used to generate a Nakagami fading channel y. In this embodiment, the Nakagami fading channel simulator U2 uses a Keysight Technologies FS8 channel simulator. During a testing process, a fading mode of the simulator is set as the Nakagami fading channel of which a maximum Doppler frequency shift $f_d$ is 500 Hz, loss is 0 dB, a Rician factor K is 10, a phase is 90°, and a Nakagami fading factor m is 1 or $(K+1)^2/(2K+1)$, that is, 5.76, one Nakagami fading channel path channel is opened, and the remaining path channels are closed. When m is 1, it is verified whether the Nakagami fading channel conforms to features of a Rayleigh fading channel. When m is 5.76, it is verified whether the Nakagami fading channel conforms to features of a Rician fading channel. A specific calculation process of impact of the value of m on Nakagami fading channel distribution is mastered by a person skilled in the art and is not described in detail herein.

The computer U3 is used to operate and analyze the Nakagami fading channel y output in a radio frequency manner from the Nakagami fading channel simulator U2, to obtain performance indexes of the Nakagami fading channel on a time domain and a frequency domain, to verify accuracy of the channel model. Without loss of generality, the computer U3 uses a PC terminal.

Figure 2:
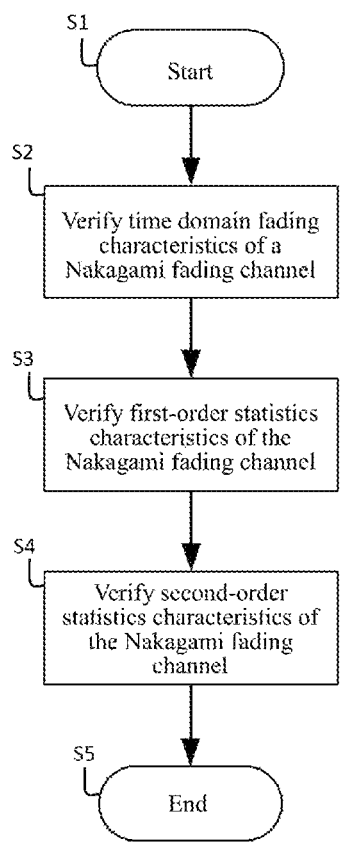
FIG. 2 is a flowchart of a Nakagami fading channel verification method according to the present invention.

Referring to FIG. 2, during implementation of the Nakagami fading channel verification method of the present invention, processes of data processing related to operation and analysis are mainly performed on a terminal of the computer U3. A process thereof includes: S1: start; S2: verify time domain fading characteristics of the Nakagami fading channel; step S3: verify first-order statistics characteristics of the Nakagami fading channel; step S4: verify second-order statistics characteristics of the Nakagami fading channel; and step S5: end.

Figure 3:
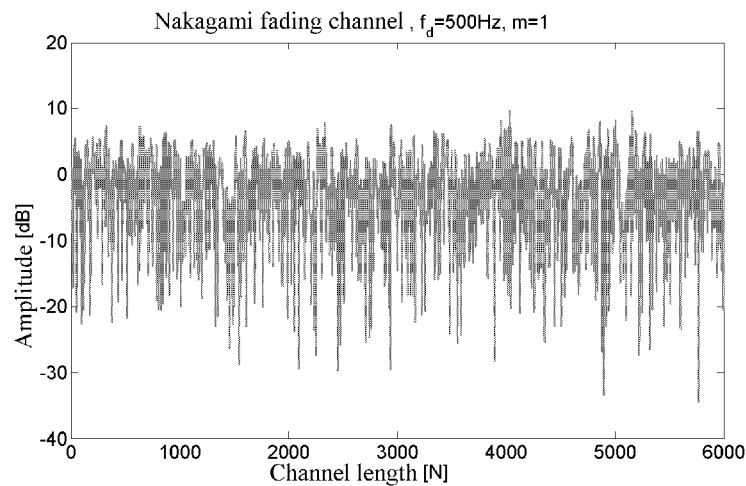
FIG. 3 is a fluctuation diagram of a time domain amplitude of a Nakagami fading channel when m=1 according to the present invention.
Figure 4A:
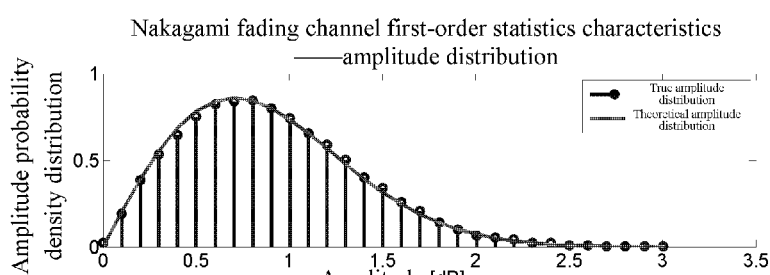
FIGS. 4A and 4B are diagrams of first-order statistics characteristics of a Nakagami fading channel when m=1 according to the present invention.
Figure 4B:
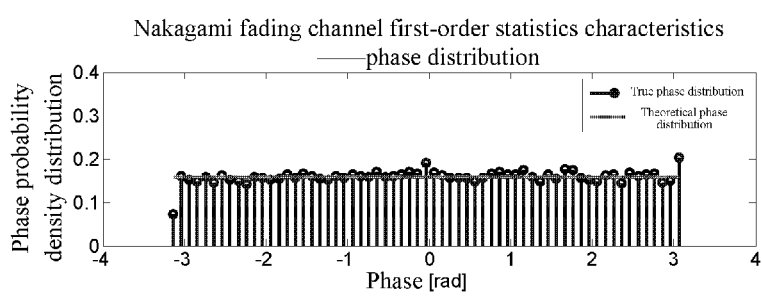
Figure 5A:
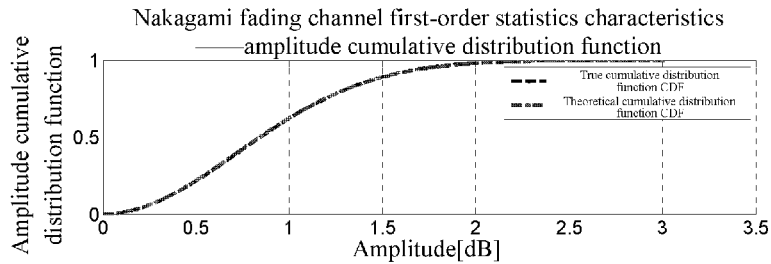
FIGS. 5A and 5B are diagrams of cumulative distribution functions of a Nakagami fading channel when m=1 according to the present invention.
Figure 5B:
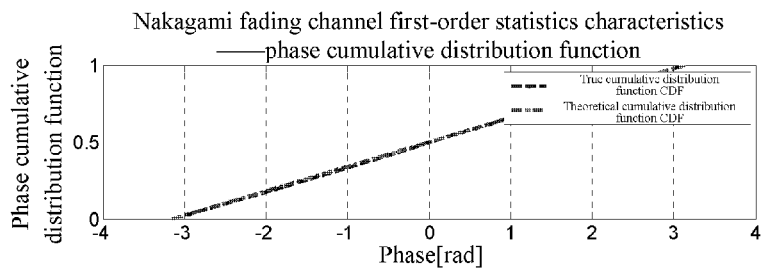
Figure 7:
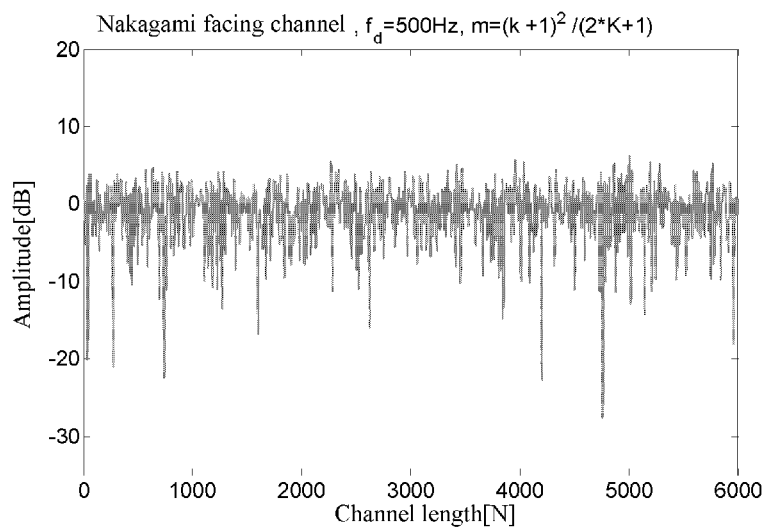
FIG. 7 is a fluctuation diagram of a time domain amplitude of a Nakagami fading channel when m=$(K+1)^2/(2K+1)$ according to the present invention.
Figure 8A:
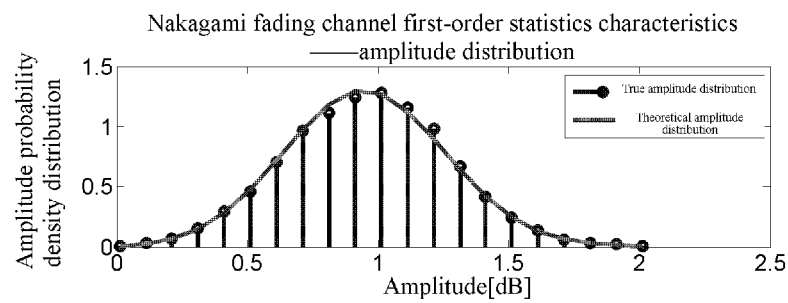
FIGS. 8A and 8B diagrams of first-order statistics characteristics of a Nakagami fading channel when m=$(K+1)^2/(2K+1)$ according to the present invention.
Figure 8B:
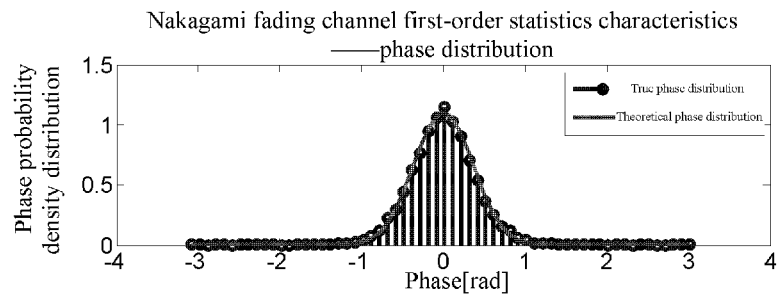
Figure 9A:
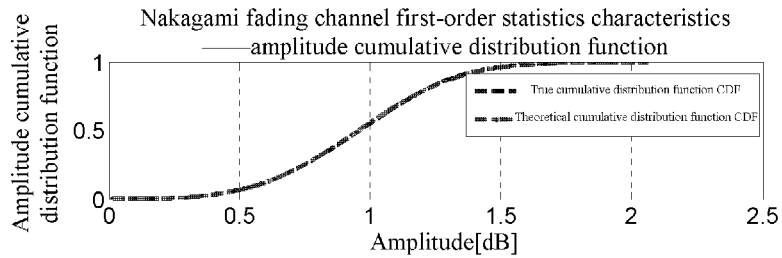
FIGS. 9A and 9B are diagrams of cumulative distribution functions of a Nakagami fading channel when m=$(K+1)^2/(2K+1)$ according to the present invention.
Figure 9B:
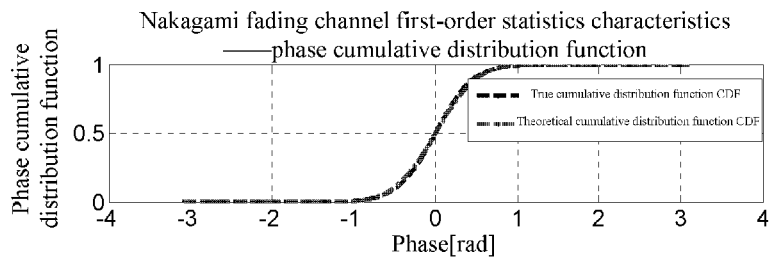

The verifying time domain fading characteristics of the Nakagami fading channel in step S2 specifically includes the following steps:

Because the amplitude of the high-frequency sine wave signal x obtained by the computer U3 stably fluctuates within a time period, a Nakagami fading channel h may be obtained by means of enveloping of the high-frequency signal y obtained by the computer U3, and then it is observed whether an amplitude waveform of the Nakagami fading channel h quickly fluctuates on the time domain, where a fluctuation range of the amplitude waveform (a fast fading signal) of the Nakagami fading channel h is 30 dB to −60 dB. When the Nakagami fading factor m is 1, the time domain fading characteristics thereof are shown in FIG. 3. When the Nakagami fading factor m is 5.76, the time domain fading characteristics thereof are shown in FIG. 7. A specific calculation process of the fluctuation range of the fast fading signal is mastered by a person skilled in the art and is not described in detail herein.

The verifying first-order statistics characteristics of the Nakagami fading channel in step S3 includes: separately performing amplitude and phase statistical analysis on the obtained Nakagami fading channel h, where it is known from theories that Rayleigh fading channel amplitude statistics is subject to Rayleigh distribution, and phase statistics is subject to uniform distribution; Rician fading channel amplitude statistics is subject to Rician distribution, and the phase statistics is subject to Gaussian distribution; that feature parameters of probability density functions of Rayleigh distribution, Rician distribution, uniform distribution, and Gaussian distribution are all represented by a are assumed; in engineering, statistical verification may be performed on the Nakagami fading channel h based on a Kolmogorov Smirnov hypothesis test theory. Without loss of generality, a verification method thereof is: first, respectively obtaining an amplitude sequence H and a phase sequence θ of the Nakagami fading channel h; then setting a significance level α, which may be usually set to 0.01; then obtaining a theoretical value of the parameter a and a corresponding confidence interval Ω by means of least squares estimation; then respectively calculating actual and theoretical cumulative distribution functions of the amplitude sequence H and the phase sequence θ; and at last, performing random distribution verification by means of Kolmogorov Smirnov (KS) hypothesis test. When the Nakagami fading factor m is 1, the first-order statistics characteristics thereof are shown in FIGS. 4A and 4B and FIGS. 5A and 5B, and a verification result shows that an amplitude is subject to Rayleigh distribution, and phase statistics is subject uniform distribution. When the Nakagami fading factor m is 5.76, the time domain fading characteristics thereof are shown in FIGS. 8A and 8B and FIGS. 9A and 9B, and the verification result shows that the amplitude is subject to Rician distribution, and the phase statistics is subject to Gaussian distribution. The verification results are both consistent with theoretical analysis. A true test simulation result is shown in Table 1. Specific implementation of the KS hypothesis test method is mastered by a person skilled in the art and is not described in detail herein.

Table 1 Distribution verification result of first-order statistics characteristics of a Nakagami fading channel of the present invention

| Value of m | Verification type | Significance level α | Theoretical parameter σ | Confidence interval Ω | True value of test statistical amount | Threshold rejecting the original hypothesis | Type of distribution to which statistics is subject |
|---|---|---|---|---|---|---|---|
| m = 1 | Amplitude sequence | 0.01 | 0.7150 | [0.7097, 0.7203] | 0.0055 | 0.0094 | Rayleigh distribution |
|  | Phase sequence | 0.01 | −3.1411; 3.1415 | [−3.142, 3.1411]; [3.1415, 3.1425] | 0.0093 | 0.0094 | Uniform distribution |
| m = 5.76 | Amplitude sequence | 0.01 | 0.9002; 0.3178 | [0.8950, 0.9053]; [0.3142, 0.3215] | 0.0084 | 0.0094 | Rician distribution |
|  | Phase sequence | 0.01 | −0.0017; 0.3969 | [−0.007, 0.0042]; [0.3928, 0.4011] | 0.0087 | 0.0094 | Gaussian distribution |

The verifying second-order statistics characteristics of the Nakagami fading channel in step S4 specifically includes: separately performing autocorrelation and Doppler power spectrum analysis on the obtained Nakagami fading channel h. In engineering, the shape and bandwidth of a power spectrum density function may be verified. In theory, when the Nakagami fading factor m is 1, the power spectrum density function is a "standard Rayleigh U-shaped power spectrum" and a spectral bandwidth is approximately $2f_d$; when the Nakagami fading factor m is $(K+1)^2/(2K+1)$, the power spectrum density function is a "standard Rician U-shaped power spectrum" and carries a line-of-sight (LOS) signal with a Doppler frequency shift, and the spectral bandwidth is approximately $2f_d$.

Figure 6A:
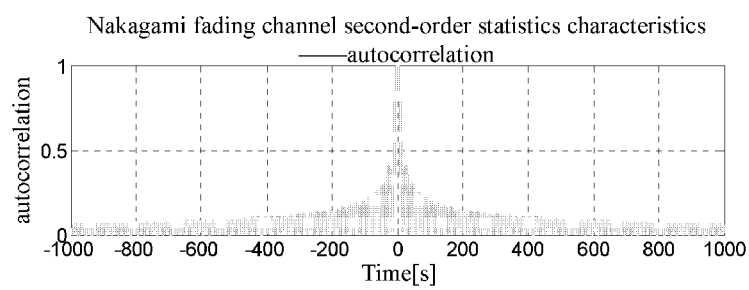
FIGS. 6A and 6B are diagrams of second-order statistics characteristics of a Nakagami fading channel when m=1 according to the present invention.
Figure 6B:
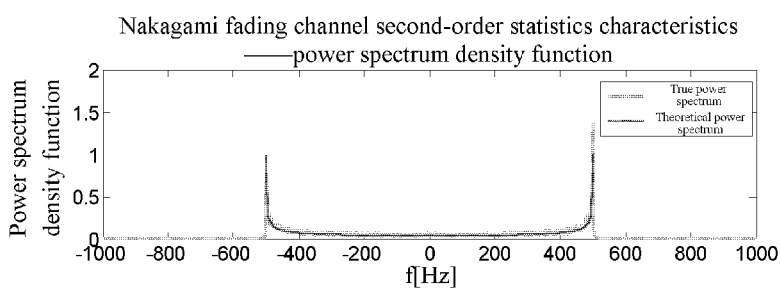

In this embodiment, when m is 1, the second-order statistics characteristics thereof are shown in FIGS. 6A and 6B, and a verification result shows that the power spectrum density function is a "standard Rayleigh U-shaped power spectrum" and a spectral bandwidth is approximately 1000

Figure 10A:
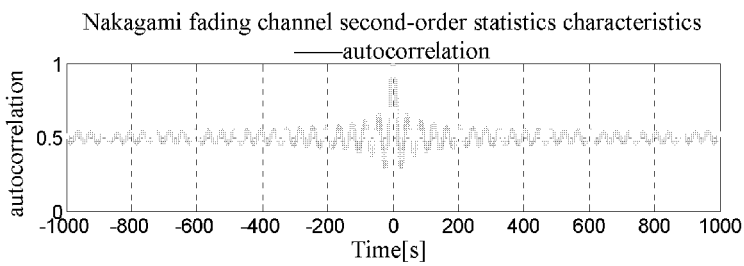
FIGS. 10A and 10B are diagrams of second-order statistics characteristics of a Nakagami fading channel when m=$(K+1)^2/(2K+1)$ according to the present invention.
Figure 10B:
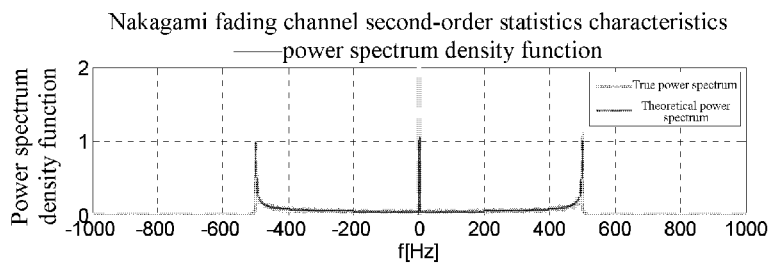

Hz and is equal to $2f_d$ (a theoretical value). When the Nakagami fading factor m is $(K+1)^2/(2K+1)$, that is, 5.76, the second-order statistics characteristics thereof are shown in FIGS. 10A and 10B, and the verification result shows that the power spectrum density function is a "standard Rician U-shaped power spectrum" and carries a line-of-sight (LOS) signal with a Doppler frequency shift 0 Hz, and the spectral bandwidth is approximately 1000 Hz and is equal to $2f_d$ (a theoretical value).

The Nakagami fading channel verification method of the present invention can implement verification of performance of the Nakagami fading channel simulator or a simulation model, has features of good stability and accuracy, and is applicable to a scenario in which a radio channel needs to be modeled and simulated, and performance of a channel simulator needs to be verified.

A person skilled in the art can perform various modifications and transformations on the present invention. If these modifications and transformations are within the scope of claims of the present invention and equivalent technologies, these modifications and transformations are also within the protection scope of the present invention.

Content that is not described in detail in the specification is the prior art well known to a person skilled in the art.

It will be apparent to those skilled in the art that various modifications and variations can be made to the structure of the present invention without departing from the scope or spirit of the invention. In view of the foregoing, it is intended that the present invention c over modifications and variations of this invention provided they fall within the scope of the following claims and their equivalents.

What is claimed is:

1. A system for testing a Nakagami fading channel, comprising:
    a signal generator;
    a Nakagami fading channel simulator; and
    a computer,
    wherein the signal generator is unidirectionally connected to the Nakagami fading channel simulator and the computer respectively by using SMA cables, and the Nakagami fading channel simulator is unidirectionally connected to the computer by using a general purpose interface bus;
    the signal generator is configured to output a sine wave signal x whose frequency is f, and the sine wave signal x is transmitted to the Nakagami fading channel simulator and the computer respectively by using the SMA cables;
    the Nakagami fading channel simulator is configured to generate the Nakagami fading channel during a testing process, and during the testing process, a maximum Doppler frequency shift $f_d$, loss, a Rician factor K, a phase, and a Nakagami fading factor m are set for the Nakagami fading channel simulator, wherein m is 1 or $(K+1)^2/(2K+1)$, one Nakagami fading channel path channel is opened, and the remaining path channels are closed, wherein during the testing process, the Nakagami fading channel simulator is configured to transmit the Nakagami fading channel to the computer through the SMA cables; and
    the computer is configured to receive the Nakagami fading channel from the Nakagami fading channel simulator through the SMA cables and the computer is configured to analyze the Nakagami fading channel, which is a radio frequency output from the Nakagami fading channel simulator, by obtaining performance indexes of the Nakagami fading channel on a time domain and a frequency domain to verify accuracy of a Nakagami fading channel model,
    wherein data processing of operation and analysis is performed on a computer, and the method comprises the following steps:
    Step S1: start a program, perform parameter initialization, and set a sampling frequency and a carrier frequency of a testing system;
    step S2: verify time domain fading characteristics of the Nakagami fading channel;
    step S3: verify first-order statistics characteristics of the Nakagami fading channel;
    step S4: verify second-order statistics characteristics of the Nakagami fading channel; and
    step S5: end the program,
    wherein verifying the time domain fading characteristics of the Nakagami fading channel in the step S2 is verifying a waveform fluctuation rate and a fluctuation range on the time domain under different Nakagami fading factors and specifically comprises:
    obtaining the Nakagami fading channel by means of enveloping of the sine wave signal obtained by e computer, then observing whether an amplitude waveform of the Nakagami fading channel quickly fluctuates on the time domain, wherein a fluctuation range of the amplitude waveform of the Nakagami fading channel is 30 dB to −60 dB; verifying whether the Nakagami fading channel conforms to features of a Rayleigh fading channel when the Nakagami fading factor m is 1; and verifying whether the Nakagami fading channel conforms to features of a Rician fading channel when the Nakagami fading factor m is $(K+1)^2/(2K+1)$.

2. The Nakagami fading channel verification method of the system for testing the Nakagami fading channel according to claim 1, wherein verifying the first-order statistics characteristics of the Nakagami fading channel in the step S3 comprises: separately performing an amplitude and a phase statistical analysis on the obtained Nakagami fading channel, wherein it is known from theories that Rayleigh fading channel amplitude statistics is subject to Rayleigh distribution, and phase statistics is subject to uniform distribution; Rician fading channel amplitude statistics is subject to Rician distribution, and the phase statistics is subject to Gaussian distribution; that feature parameters of probability density functions of Rayleigh distribution, Rician distribution, uniform distribution, and Gaussian distribution are all represented by σ are assumed; in engineering, statistical verification is performed on the Nakagami fading channel based on a Kolmogorov Smirnov hypothesis test, and a verification method is:
    S31: respectively obtain an amplitude sequence H and a phase sequence θ of the Nakagami fading channel;
    S32: set a significance level α;
    S33: obtain a theoretical value of the parameter σ and a corresponding confidence interval Ω by means of least squares estimation;
    S34: respectively calculate true and theoretical cumulative distribution functions of the amplitude sequence H and the phase sequence θ; and
    S35: perform random distribution verification by means of Kolmogorov Smirnov hypothesis test.

3. The Nakagami fading channel verification method of the system for testing the Nakagami fading channel according to claim 1, wherein verifying the second-order statistics characteristics of the Nakagami fading channel in the step S4 specifically comprises:

separately performing autocorrelation and Doppler power spectrum analysis on the obtained Nakagami fading channel, to verify a shape and a bandwidth of a power spectrum density function, wherein when the Nakagami fading factor m is 1, the power spectrum density function is a "standard Rayleigh U-shaped power spectrum" and a spectral bandwidth is $2f_d$; when the Nakagami fading factor m is $(K+1)^2/(2K+1)$, the power spectrum density function is a "standard Rician U-shaped power spectrum" and carries a line-of-sight signal with a Doppler frequency shift, and the spectral bandwidth is $2f_d$.

\* \* \* \* \*